(12) United States Patent
Zhou (10) Patent No.: US 10,361,305 B2
(45) Date of Patent: Jul. 23, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/941,225

(22) Filed: Mar. 30, 2018

(65) Prior Publication Data

US 2018/0286983 A1 Oct. 4, 2018

(30) Foreign Application Priority Data

Mar. 30, 2017 (CN) .......................... 2017 1 0203255

(51) Int. Cl.
*H01L 29/78* (2006.01)
*H01L 21/266* (2006.01)
(Continued)

(52) U.S. Cl.
CPC ........ *H01L 29/7848* (2013.01); *H01L 21/266* (2013.01); *H01L 21/26513* (2013.01);
(Continued)

(58) Field of Classification Search
CPC ............. H01L 29/7848; H01L 29/0649; H01L 21/823878; H01L 21/823821;
(Continued)

(56) References Cited

U.S. PATENT DOCUMENTS

9,166,044 B2 * 10/2015 Lu ....................... H01L 29/7833
9,515,167 B2 * 12/2016 Lu ....................... H01L 29/7833
(Continued)

*Primary Examiner* — Earl N Taylor
(74) *Attorney, Agent, or Firm* — Anova Law Group, PLLC (57) ABSTRACT

Semiconductor structures and fabrication methods are provided. An exemplary fabrication method includes providing a base substrate having a semiconductor substrate and a plurality of fins on the semiconductor substrate; forming an isolation structure on the semiconductor substrate, between adjacent fins and with a top surface lower than the top surfaces of the fins; forming a gate structure across of the fins by covering portions of top and side surfaces of the fins; forming a sidewall material layer to cover the gate structure and the fins; etching the sidewall material layer to form gate sidewall spacers on side surfaces of the gate structure and shadowing sidewall spacers on portions of side surfaces of the fins adjacent to the isolation structure; and performing an ion implantation process on the fins using the gate sidewall spacers and the shadowing sidewall spacers as a mask to form lightly doped regions in the fins.

20 Claims, 6 Drawing Sheets (51) Int. Cl.
  *H01L 21/265* (2006.01)
  *H01L 21/324* (2006.01)
  *H01L 29/66* (2006.01)
  *H01L 27/092* (2006.01)
  *H01L 29/06* (2006.01)
  *H01L 29/08* (2006.01)
  *H01L 29/165* (2006.01)
  *H01L 29/267* (2006.01)
  *H01L 21/8238* (2006.01)
  *H01L 21/3065* (2006.01)

(52) U.S. Cl.
  CPC ........ *H01L 21/3065* (2013.01); *H01L 21/324* (2013.01); *H01L 21/823814* (2013.01); *H01L 21/823821* (2013.01); *H01L 21/823878* (2013.01); *H01L 27/0924* (2013.01); *H01L 29/0649* (2013.01); *H01L 29/0847* (2013.01); *H01L 29/165* (2013.01); *H01L 29/267* (2013.01); *H01L 29/6659* (2013.01); *H01L 29/66636* (2013.01); *H01L 29/66803* (2013.01); *H01L 29/785* (2013.01); *H01L 29/7834* (2013.01)

(58) Field of Classification Search
  CPC . H01L 29/7834; H01L 29/267; H01L 29/165; H01L 29/0847; H01L 21/266; H01L 27/0924; H01L 21/3065; H01L 29/66636; H01L 29/6659; H01L 21/324; H01L 21/26513; H01L 21/823814
  See application file for complete search history.

(56) References Cited

U.S. PATENT DOCUMENTS

| | | | |
|---|---|---|---|
| 9,941,368 B2* | 4/2018 | Lu | H01L 29/7833 |
| 2014/0252412 A1* | 9/2014 | Tsai | H01L 21/02521 |
| | | | 257/192 |
| 2015/0091086 A1* | 4/2015 | Lu | H01L 29/7833 |
| | | | 257/336 |
| 2016/0013297 A1* | 1/2016 | Lu | H01L 29/7833 |
| | | | 438/283 |
| 2016/0093740 A1* | 3/2016 | Harley | H01L 29/7851 |
| | | | 257/347 |
| 2017/0084709 A1* | 3/2017 | Lu | H01L 29/7833 |
| 2017/0250278 A1* | 8/2017 | Tsai | H01L 29/7833 |
| 2018/0130710 A1* | 5/2018 | Yi | H01L 21/26586 |
| 2018/0286962 A1* | 10/2018 | Bao | H01L 29/66795 |
| 2018/0286983 A1* | 10/2018 | Zhou | H01L 21/266 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710203255.1, filed on Mar. 30, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the rapid development of semiconductor manufacturing technologies, semiconductor devices have been developed toward higher device density and higher integration level. Transistors have been widely used as the basic semiconductor devices. With the continuous increase of the device density and the integration level of the semiconductor devices, the gate sizes of the planar transistors have been continuously reduced. Accordingly, the control ability of the conventional planar transistors to their channel regions has become weaker and weaker. Thus, the short channel effect is generated; and the leakage current is increased. As a result, the electrical properties of the semiconductor devices are adversely affected.

To further reduce the sizes of the metal-oxide-semiconductor field-effect transistors (MOSFETs), multiple-gate field-effect transistors have been developed so as to increase the control ability of the gates of the MOSFETs; and reduce the short channel effect. Fin field-effect transistors (FinFETs) are a typical type of multiple-gate transistors. In an FinFET, the ultra-thin members (fins) can be controlled from at least two sides. Thus, comparing with the planar MOSFET, the control ability to the channel region is significantly enhanced; and the short channel effect is efficiently reduced. Further, comparing with other devices, FinFETs have a better compatibility with the existing fabrication technologies of the integrated circuits (ICs).

However, it is still desirable to enhance the performance of the FinFETs. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate having a semiconductor substrate and a plurality of fins on the semiconductor substrate; forming an isolation structure on the semiconductor substrate, between adjacent fins and with a top surface lower than the top surfaces of the fins; forming a gate structure across of the fins by covering portions of top surfaces and side surfaces of the fins; forming a sidewall material layer to cover the gate structure and the fins; etching the sidewall material layer to form gate sidewall spacers on side surfaces of the gate structure and shadowing sidewall spacers on portions of side surfaces of the fins adjacent to the isolation structure; and performing an ion implantation process on the fins using the gate sidewall spacers and the shadowing sidewall spacers as a mask to form lightly doped regions in the fins.

Another aspect of the present disclosure includes a semiconductor structure. The semiconductor structure includes a base substrate having a semiconductor substrate and a plurality of the fins on the semiconductor substrate; an isolation structure on the semiconductor substrate between adjacent fins and with a top surface lower than surfaces of the fins; a gate structure across the fins by covering portions of side and top surfaces of the fins; sidewall spacers on side surfaces of the gate structure; and doped source/drain regions in the fins at two sides of the gate structure. The doping concentration of portions of the fins away from the isolation structure is greater than the doping concentration of portions of the fins adjacent to the isolation structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
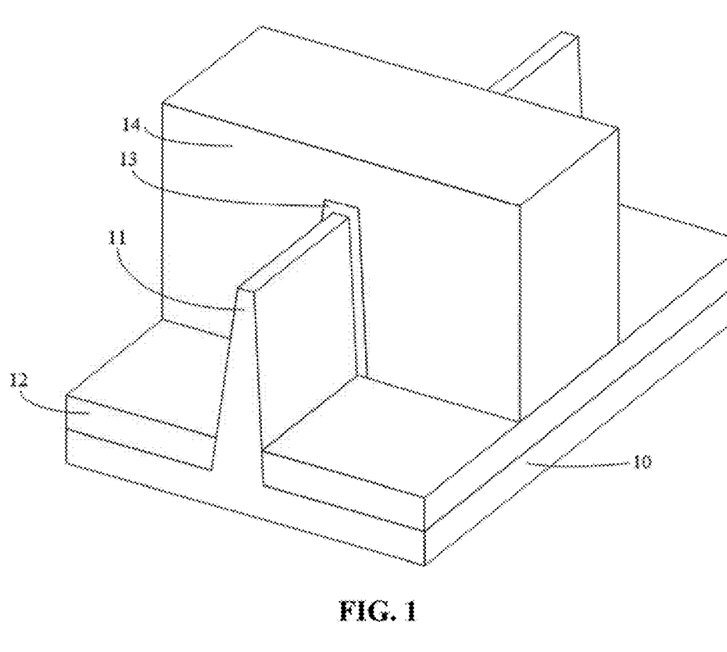
FIGS. 1-2 illustrate structures corresponding to certain stages during a fabrication process of a semiconductor structure.
Figure 2:
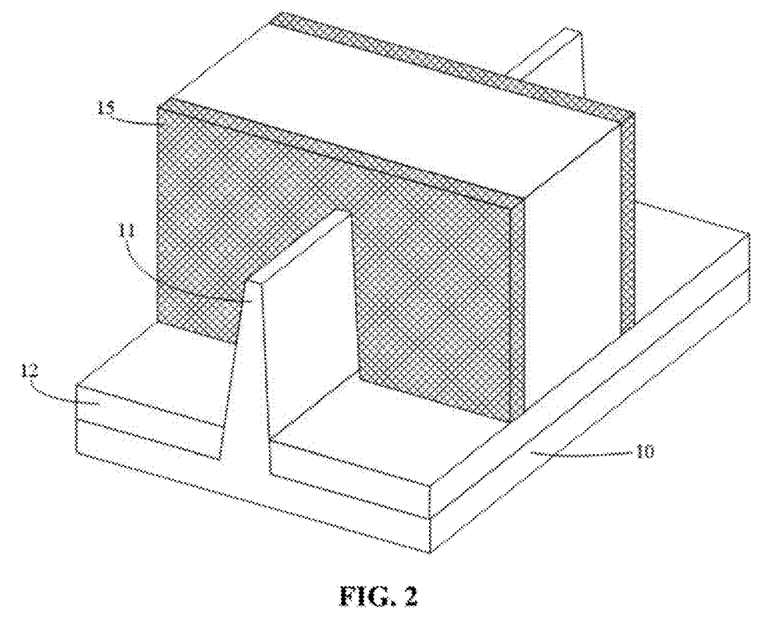

FIGS. 1-2 illustrate three dimensional views of structures corresponding to certain stages during a fabrication process of a semiconductor structure.

As shown in FIG. 1, the fabrication process includes providing a semiconductor substrate 10 and forming a plurality of fins 11 on the semiconductor substrate 10. The process also includes forming an isolation structure 12 on the semiconductor substrate 10 among adjacent fins 11; and forming a gate structure (not labeled) over the semiconductor substrate 10.

The top surface of the isolation structure 12 may be below the top surfaces of the fins 11; and the gate structure covers portions of the side surfaces and top surfaces of the fins 11. The gate structure includes a gate dielectric layer 13 on the fins 11 and a gate electrode layer 14 on the gate dielectric layer 13.

Further, as shown in FIG. 2, sidewall spacers 15 may be formed on the side surfaces of the gate structure; and lightly doped regions (not shown) may be formed in the fins 11 by an ion implantation process.

During the ion implantation process, because the doping concentration of the portions of the fins adjacent to isolation structure 12 is relatively high, it is easy to have a short channel effect, or even to have a source-drain breakdown.

The present disclosure provides a semiconductor structure and a fabrication method. The fabrication method may include providing a base substrate having a semiconductor substrate and a plurality of fins on the semiconductor substrate; and forming an isolation structure on the semiconductor substrate and among the fins. The top surface of the isolation structure may be below the top surfaces of the fins. The method may also include forming a gate structure over the semiconductor substrate and across the fins by covering portions of the top and side surfaces of the fins; and forming a sidewall material layer to cover the gate structure and the fins. Further, the method may also include etching the sidewall material layer to form gate sidewall spacers on the side surfaces of the gate structure and shadowing sidewall spacers on the portions of the side surfaces of the fins adjacent to the isolation structure; and performing an ion implantation process on the fins using the gate sidewall spacers and the shadowing sidewall spacers as a mask to form lightly doped regions in the fins.

In the present disclosure, shadowing sidewall spacers may be formed on the side surfaces of the fins when the gate sidewall spacers are formed on the gate structure. The shadowing sidewall spacers may be adjacent to the isolation structure and away from the top surfaces of the fins. Then, the ion implantation process may be performed on the fins to form lightly doped regions. Because of the protection of the shadowing sidewall spacers, the ion concentration of the bottoms of the fins covered by the shadowing sidewall spacers may be relatively low. Thus, the source-drain breakdown may be prevented; and the short channel effect may be reduced.

Figure 9:
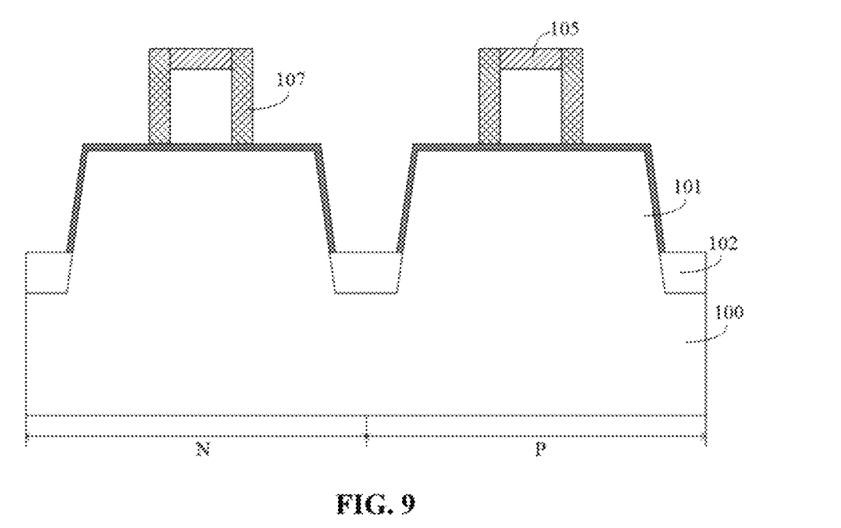
Figure 10:
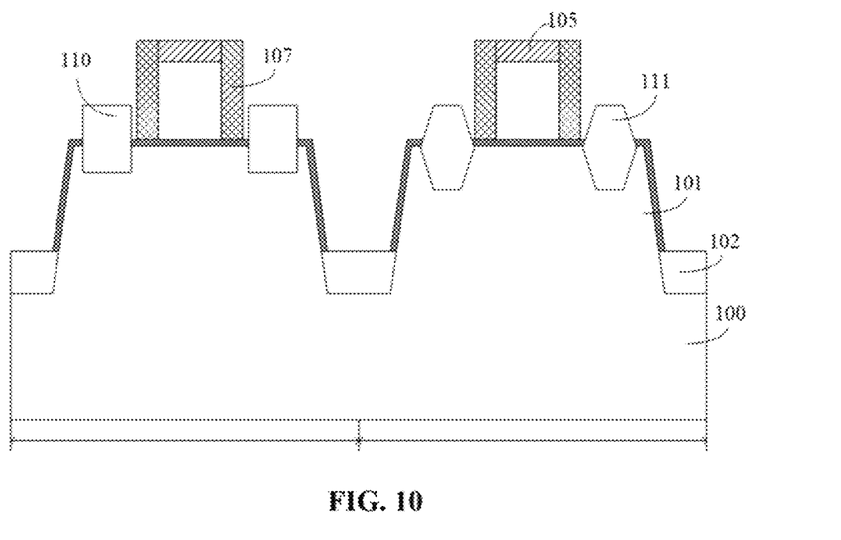
Figure 11:
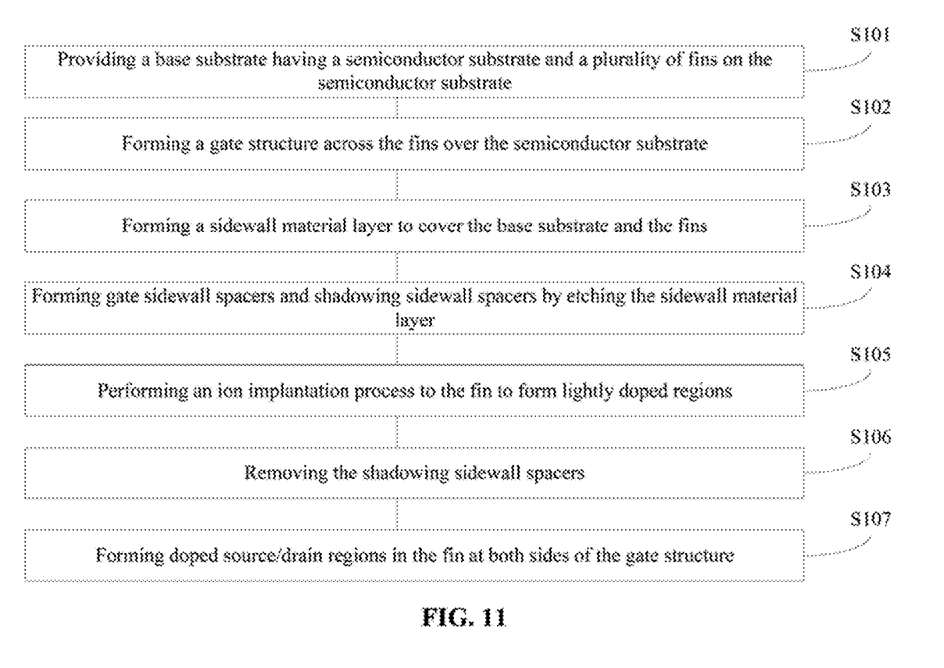
FIG. 11 illustrates an exemplary fabrication process of a semiconductor structure consistent with various disclosed embodiments.

FIG. 11 illustrates an exemplary fabrication process of a semiconductor structure consistent with various disclosed embodiments. FIGS. 3-10 illustrate structures corresponding to certain stages during the exemplary fabrication process.

Figure 3:
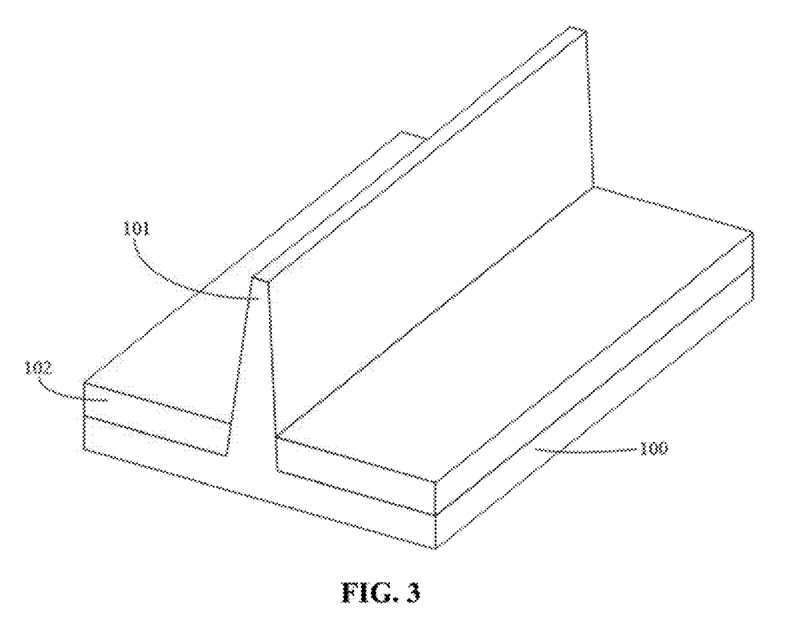
FIGS. 3-10 illustrate structures corresponding to certain stages during an exemplary fabrication process of a semiconductor structure consistent with various disclosed embodiments.

As shown in FIG. 11, at the beginning of the fabrication process, a base substrate with certain structures is provided (S101). FIG. 3 illustrates a corresponding semiconductor structure.

As shown in FIG. 3, a base substrate is provided. The base substrate may include a semiconductor substrate 100 and a plurality of fins 101 formed on the semiconductor substrate 100. For illustrative purposes, in one embodiment, one fin 101 is shown. An isolation structure 102 may be formed on the surface of the semiconductor substrate 100 between adjacent fins 101. The top surface of the isolation structure 102 may be below the top surfaces of the fins 101. As used herein, the top surface of the isolation structure 102 is relative to a bottom surface of the isolation structure 102; and the bottom surface of the isolation structure 102 is referred to as the surface of the isolation structure 102 contacting with the surface of the semiconductor substrate 100.

In one embodiment, the semiconductor substrate 100 and the fins 101 are made of single crystalline silicon.

In some embodiments, the semiconductor substrate may be made of one of germanium, gallium arsenide, silicon germanium compound, or other appropriate semiconductor material. The semiconductor substrate may also be a substrate having an epitaxial layer, or a substrate having a silicon-on-epitaxial-layer structure.

The semiconductor substrate and the fins may also be made of different materials. Further, semiconductor layers to achieve different functions may also be formed on the semiconductor substrate. The semiconductor substrate may also be made of a material to match the process requirements and/or a material that is easy to be integrated with other material (s). Further, the semiconductor layers may be made of a material that is easy to form the fins.

A process for providing the base substrate may include providing an initial base substrate; forming a patterned fin mask layer on the initial base substrate; and etching the initial base substrate using the fin mask layer as an etching mask to form the semiconductor substrate 100 and the discrete fins 101.

In one embodiment, the isolation structure 102 is made of silicon oxide. In some embodiments, the isolation structure 102 may be made of silicon nitride, or silicon oxynitride, etc.

The process for forming the isolation structure 102 may include forming an isolation material layer on the semiconductor substrate 100 between adjacent fins 101 and covering the fin mask layer; and removing a partial thickness of the isolation material layer to form the isolation structure 102 until the top surface of the isolation structure 102 is below the top surfaces of the fins 101 and top portions of the side surfaces of the fins 101 are exposed.

Figure 4:
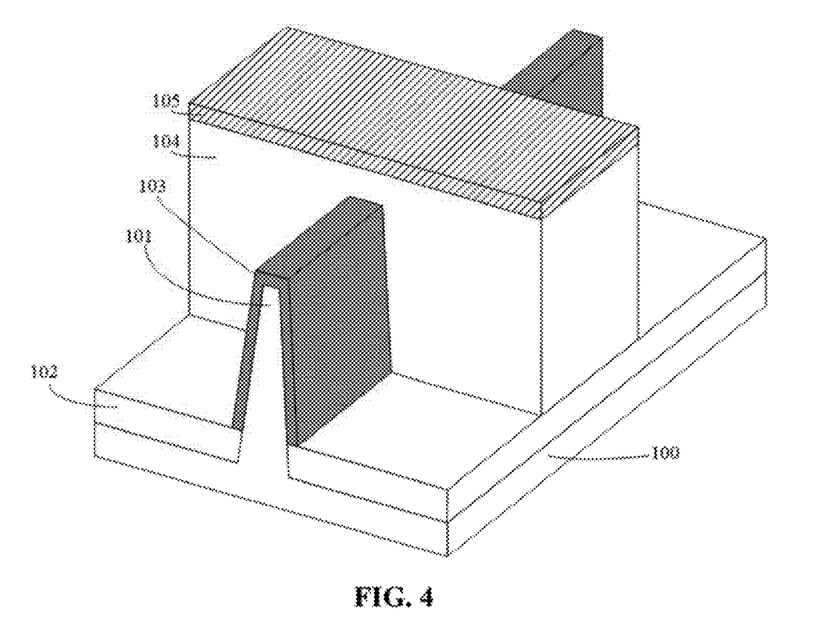
Figure 5:
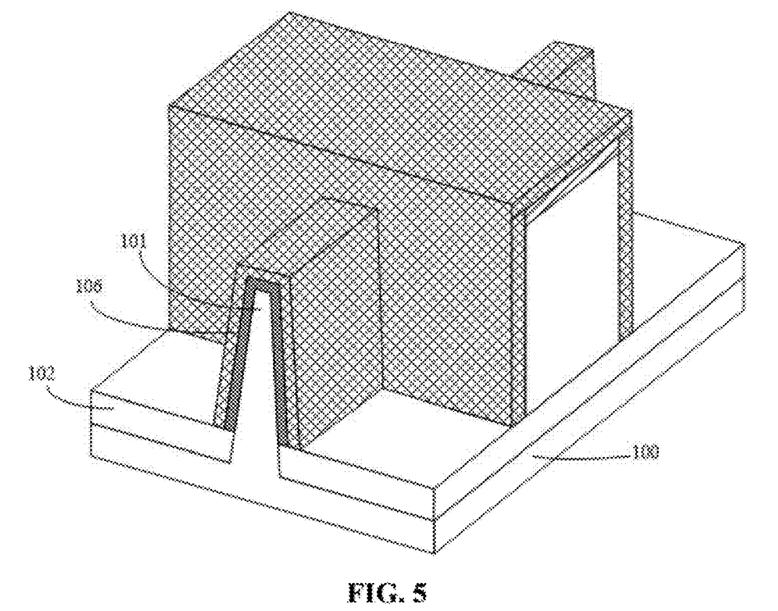

Returning to FIG. 11, after providing the base substrate with the certain structures, a gate structure may be formed (S102). FIG. 4 illustrates a corresponding semiconductor structure.

As shown in FIG. 4, a gate structure is formed on the base substrate. The gate structure may be across the fins 101 by covering portions of the side and top surfaces of the fin 101.

The gate structure may be used to form the gate of the transistor. Further, the gate structure may also be used to cover portions of the fin 101 during the subsequent process (es) for forming the source region and/or the drain region to prevent the source region from directly connecting with the drain region.

The gate structure may include a gate dielectric layer 103 on the surface of the fin 101 and a gate electrode layer 104 on the gate dielectric layer 103. The gate dielectric layer 103 may be used to isolate the gate electrode layer 104 from the channel region of the transistor.

The gate dielectric layer 103 may be made of any appropriate material, such as high dielectric constant (high-K) material, etc. The gate electrode layer 104 may be made of any appropriate material, such as polysilicon, or metal, etc.

Further, a hard mask layer 105 may be formed on the gate electrode layer 104. The hard mask layer 105 may be used to define the size and position of the gate structure. In one embodiment, the hard mask layer 105 is made of silicon nitride. The hard mask layer may also be a multiple layer structure.

In some embodiments, the gate structure may be a dummy gate structure. The dummy gate structure may reserve the spatial space for the subsequently formed gate structure.

Figure 6:
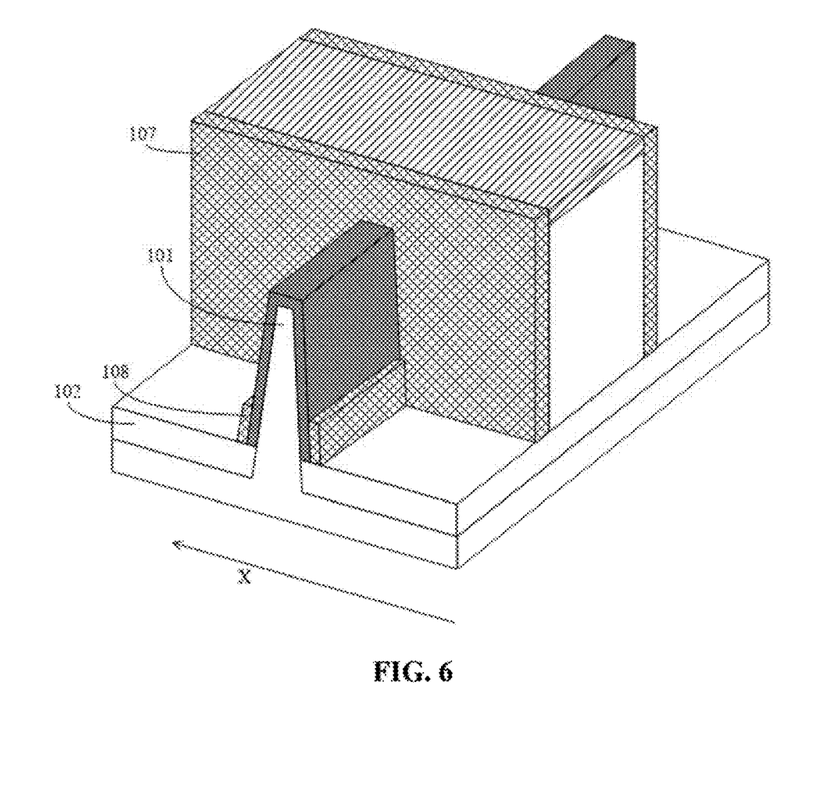

Returning to FIG. 11, after forming the gate structure, a sidewall material layer may be formed (S103). FIG. 6 illustrates a corresponding semiconductor structure.

As shown in FIG. 6, a sidewall material layer 106 is formed. The sidewall material layer 106 may cover the gate structure and the fin 101. The sidewall material layer 106 may be used to subsequently form gate sidewall spacers and shadowing sidewall spacers.

In one embodiment, the sidewall material layer 106 is a single layer structure made of silicon nitride. In some embodiments, the sidewall material layer may also be made of silicon oxide, silicon oxynitride, silicon carbide, silicon oxycarbide, or silicon carbonitride, etc. In other embodiments, the sidewall material layer may also be a multiple-layer stacked structure.

In one embodiment, the hard mask layer 105 may be formed on the top surface of the gate structure. Thus, the sidewall material layer 106 may also cover the hard mask layer 105.

The sidewall material layer 106 may be formed by any appropriate process, such as a chemical vapor deposition (CVD) process, a physical vapor deposition (PVD) process, or a plasma-enhanced chemical vapor deposition (PECVD) process, etc. In one embodiment, the sidewall material layer 106 is formed by a CVD process.

The thickness of the sidewall material layer 106 may be any appropriate value. If the thickness of the sidewall material spacer 106 is too large, the process difficulty may be increased; and it may cause a waste of material. If the thickness of the sidewall material layer 106 is too small, the thickness of the subsequently formed shadowing sidewall spacers may also be too small. Thus, the shadowing effect of the shadowing sidewall spacers to the bottom portions of the fin 101 may be reduced during the subsequent ion implantation process. Thus, in one embodiment, the thickness of the sidewall material layer 106 may be in a range of approximately 15 Å-80 Å.

Returning to FIG. 11, after forming the sidewall material layer, gate sidewall spacers and shadowing sidewall spacers may be formed (S104). FIG. 6 illustrates a corresponding semiconductor structure.

As shown in FIG. 6, gate sidewall spacers 107 are formed on the side surfaces of the gate structure; and shadowing sidewall spacers 108 are formed on portions of the side surfaces of the fin 101 adjacent to the isolation structure 102, i.e. the bottom portions of the fin 101. The gate sidewall spacers 107 and the shadowing sidewall spacers 108 may be formed by etching the sidewall material layer 106.

The gate sidewall spacers 107 may be used to control the distance between the subsequently formed epitaxial layer and the channel region of the transistor. In one embodiment, the gate sidewall spacers 107 are single-layer structures made of silicon nitride. In some embodiments, the gate sidewall spacers may be made of silicon oxide, silicon oxynitride, silicon carbide, silicon oxycarbide, or silicon oxycarbonitride, etc. The gate sidewall spacers may also be multiple-layer structures.

The shadowing sidewall spacers 108 may be used to protect the bottom portion of the fin 101, i.e., the portion of the fin 101 adjacent to the isolation structure 102, during the subsequent ion implantation process. Because of the protection of the shadowing sidewall spacers 108, the doping concentration of the bottom portion of the fin 101 may be relatively low. Thus, the source-drain breakdown may be effectively prevented; and the short channel effect may be sufficiently reduced.

The sidewall material layer 106 may be etched by any appropriate process. In one embodiment, a dry etching process is used to etch the sidewall material layer 106 to form the gate sidewall spacers 107 and the shadowing sidewall spacers 108.

The etching gases of the dry etching process may include $CF_4$, $CH_3F$, and $O_2$, etc. The flow rate of $CF_4$ may be in range of approximately 5 sccm-100 sccm. The flow rate of $CH_3F$ may be in a range of approximately 8 sccm-50 sccm. The flow rate of 02 may be in a range of approximately 10 sccm-100 sccm. The radio frequency power of the dry etching process may be in a range of approximately 50 W-300 W. The DC voltage of the dry etching process may be in a range of approximately 30 V-100 V. The pressure of the dry etching process may be in a range of approximately 10 mTorr-2000 mTorr. The etching time may be in a range of approximately 4 s-50 s.

The height of the shadowing sidewall spacers 108 may be any appropriate value. If the height of the shadowing sidewall spacers 108 is too large, the effect of the lightly doped regions for reducing the short channel effect may be reduced. If the height of the shadowing sidewall spacers 108 is too small, the ion concentration of the bottom portions of the fin 101 may not be effectively controlled; and the source-drain breakdown may not be effectively prevented. Thus, in one embodiment, the height of the shadowing sidewall spacers 108 may be in a range of approximately 100 Å-350 Å.

Figure 7:
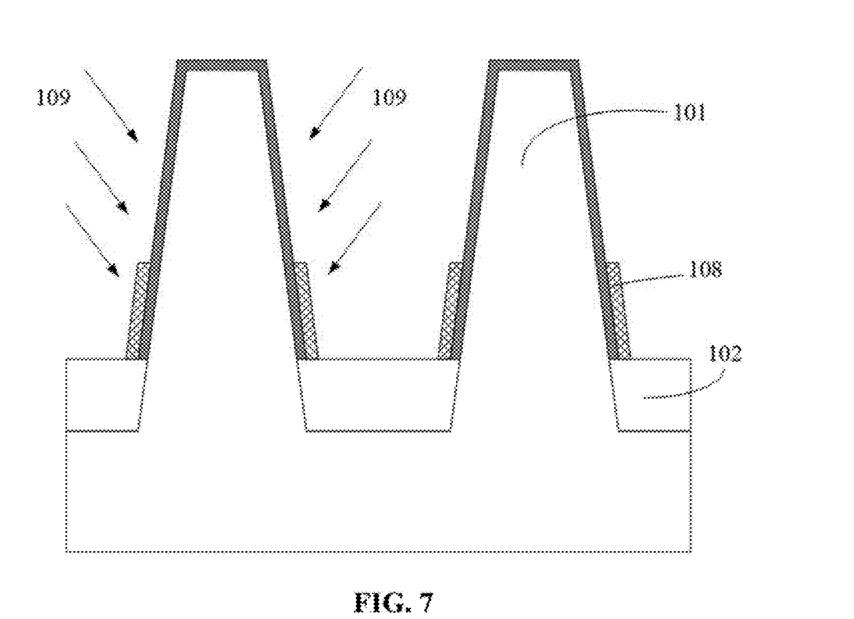

Returning to FIG. 11, after forming the gate sidewall spacers and the shadowing sidewall spacers, an ion implantation process may be performed (S105). FIG. 7 illustrates a corresponding structure. FIG. 7 is a cross-sectional view of the exposed portion of the fin 101 in FIG. 6 along the "X" direction.

As shown in FIG. 7, an ion implantation process 109 is performed on the fin 101 using the gate sidewall spacers 107 and the shadowing spacers 108 as a mask to form lightly doped regions (not labeled) in the fin 101.

In one embodiment, the semiconductor substrate 100 may include an N-type region for an N-type semiconductor device and a P-type region for a P-type semiconductor device. An N-type ion implantation process may be performed on the N-type region first. The ions of the N-type lightly doped ion implantation process may include As ions, etc. The dose of the N-type ions may be in a range of approximately $1.0E14$ atom/cm$^2$-$1.0E16$ atom/cm$^2$. Then, a P-type ion implantation process may be performed on the P-type region. The ions of the P-type lightly doped ion implantation process may include P ions, etc. The dose of the P-type ions may be in a range of approximately $1.0E14$ atom/cm$^2$-$8.0E15$ atom/cm$^2$. In some embodiments, a P-type ion implantation process may be performed first, then the N-type ion implantation process may be performed.

In some embodiments, the semiconductor substrate may only include an N-type region, or may only include a P-type region.

Figure 8:
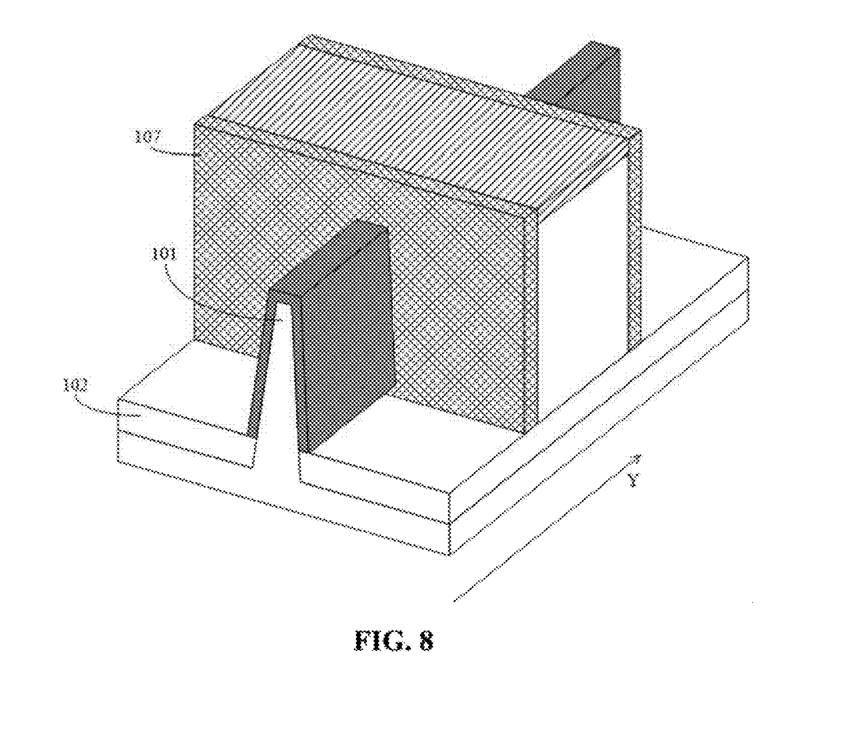

Returning to FIG. 11, after forming the lightly doped regions, the shadowing sidewall spacers may be removed (S106). FIGS. 8-9 illustrate a corresponding semiconductor structure. FIG. 9 is a cross-sectional view of the fin 101 illustrated in FIG. 8 along the "Y" direction. For illustrative purposes, in one embodiment, the semiconductor substrate 100 includes an N-type region for an N-type semiconductor structure and a P-type region for a P-type semiconductor device.

The shadowing sidewall spacers 108 may be removed by any appropriate process. In one embodiment, a dry etching process is used to remove the shadowing sidewall spacers 108.

Returning to FIG. 11, after removing the shadowing sidewall spacers, doped source/drain regions may be formed (S107). FIG. 10 illustrates a corresponding semiconductor structure.

As shown in FIG. 10, source/drain doping regions are formed in the fin 101 at two sides of the gate structure. The doped source/drain regions may be formed by forming stress layers in the fin 101 at two sides of the gate structure, followed by performing an ion implantation processes on the stress layers.

In one embodiment, the stress layer in the N-type region may be referred to as a first stress layer 110; and the stress layer in the P-type region may be referred to as a second stress layer 111.

In one embodiment, the first stress layer 110 may be made of phosphor doped silicon (SiP); and the first stress layer 110 may be U-shaped. The first stress layer 110 may provide a tensile stress to the channel region in the N-type region because of the crystal lattice mismatch between Si and SiP. Thus, the carrier mobility of the channel region may be increased; and the performance of the transistor may be enhanced.

In one embodiment, the second stress layer 111 may be made of silicon germanium (SiGe); and the second stress layer 111 may be Σ-shaped. The second stress layer 111 may provide a compressive stress to the channel region in the P-type region because of the crystal lattice mismatch between Si and SiGe. Thus, the carrier mobility of the channel region may be increased; and the performance of the transistor may be enhanced.

After the ion implantation process, a thermal annealing process may be performed; and doped source/drain regions may be formed in the fin 101 at two sides of the gate structure.

The present disclosure also provides a semiconductor structure. FIG. 10 illustrates a corresponding semiconductor structure.

As shown in FIG. 10, the semiconductor structure may include a base substrate having a semiconductor substrate 100 and a plurality of fins 101 on the semiconductor substrate 100; and an isolation structure 102 on the semiconductor substrate 100, between adjacent fins 101 and with a top surface below the top surfaces of the fins 101. The semiconductor structure may also include a gate structure across the fins 101 by covering portions of side and top surfaces of the fins 101; and gate sidewall spacers 107 on the side surfaces of the gate structure. Further, the semiconductor structure may also include doped source/drain regions in the fins 101 at both sides of the gate structure. The doping concentration of the portions of the fins 101 away from the isolation structure 102 may be greater than the doping concentration the portions of the fins 101 adjacent to the isolation structure 102.

In one embodiment, the semiconductor substrate 100 and the fins 101 are made of single crystalline silicon.

In some embodiments, the semiconductor substrate may be made of one of germanium, gallium arsenide, silicon germanium compound, or other appropriate semiconductor material. The semiconductor substrate may also be a substrate having an epitaxial layer, or a substrate having a silicon-on-epitaxial-layer structure.

The semiconductor substrate and the fins may also be made of different materials. Further, semiconductor layers to achieve different functions may also be formed on the semiconductor substrate. The semiconductor substrate may also be made of a material to match the process requirements and/or a material that is easy to be integrated with other materials. Further, the semiconductor layers may be made of a material that is easy to form the fins.

In one embodiment, the isolation structure 102 is made of silicon oxide. In some embodiments, the isolation structure may be made of silicon nitride, or silicon oxynitride, etc.

The gate structure may include a gate dielectric layer 103 on the surface of the fins 101 and a gate electrode layer 104 on the gate dielectric layer 103. The gate dielectric layer 103 may be used to isolate the gate electrode layer 104 from the channel region of the transistor.

The gate dielectric layer 103 may be made of any appropriate material, such as high dielectric constant (high-K) material, etc. The gate electrode layer 104 may be made of any appropriate material, such as polysilicon, or metal, etc.

Further, a hard mask layer 105 may be formed on the gate electrode layer 104. The hard mask layer 105 may be used to define the size and the position of the gate structure. In one embodiment, the hard mask layer 105 is made of silicon nitride. The hard mask layer may also be a multiple layer structure In one embodiment, the gate sidewall spacers 107 are single layers structures made of silicon nitride. In some embodiments, the gate sidewall spacers may be made of silicon oxide, silicon oxynitride, silicon carbide, silicon oxycarbide, or silicon oxycarbonitride, etc. The gate sidewall spacers may also be multiple-layer structure. The thickness of the gate sidewall spacers 107 may be in a range of approximately 60 nm-200 nm.

The doping concentration of the portions of the fins 101 away from the isolation structure 102 may be greater than the doping concentration of the portions of fins 101 adjacent to the isolation structure 102 approximately 1.3 time-2 times.

In one embodiment, the semiconductor substrate 100 may include an N-type region for forming an N-type transistor and a P-type region used for forming a P-type transistor. In the N-type region, the doping concentration of the portions of the fins 101 away from the isolation structure 102 may be in a range of approximately $1.0E20$ atom/cm$^3$-$1.0E22$ atom/cm$^3$; and the doping concentration of the portions of the fins 101 adjacent to the isolation structure 102 may be in a range of approximately $1.8E19$ atom/cm$^3$-$1.5E21$ atom/cm$^3$. In the P-type region, the doping concentration of the portions of the fins 101 away from the isolation structure 102 may be in a range of approximately $1.0E20$ atom/cm$^3$-$1.0E22$ atom/cm$^3$; and the doping concentration of the portions of the fins 101 adjacent to the isolation structure 102 may be in a range of approximately $1.8E19$ atom/cm$^3$-$1.5E21$ atom/cm$^3$.

In one embodiment, the semiconductor structure may also include a first stress layer 110 in the fin 101 in the N-type region at both sides of the gate structure; and a second stress layer 111 in the fin 101 in the P-type region at both sides of the gate structure. Doped source/drain regions may be formed in the stress layers; and the doped source/drain regions may be portions of the stress layers.

Thus, in the disclosed embodiments, shadowing sidewall spacers may also be formed on portions of the side surfaces of the fins during the process for forming the gate sidewall spacers on the gate structure. The shadowing sidewall spacers may be adjacent to the isolation structure and away from the top surfaces of the fins. A lightly doped ion implantation process may be subsequently performed to form lightly doped regions in the fins. Because of the protection of the shadowing sidewall spacers, the doping concentration of the bottom portions of the fins covered by the shadowing sidewall spacers may be relatively low. Accordingly, the source-drain breakthrough may be effectively prevented; and the short channel effect may be effectively reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a base substrate having a semiconductor substrate and a plurality of fins on the semiconductor substrate;

forming an isolation structure on the semiconductor substrate, between adjacent fins and with a top surface lower than top surfaces of the fins;
forming a gate structure, including a gate dielectric layer and a gate electrode layer, across of the fins by covering portions of top surfaces and side surfaces of the fins;
forming a sidewall material layer to cover the gate structure and the fins;
etching the sidewall material layer to form gate sidewall spacers on side surfaces of the gate structure and to form shadowing sidewall spacers on portions of the side surfaces of the fins adjacent to the isolation structure, wherein the shadowing sidewall spacers are isolated from the fins by the gate dielectric layer and the gate dielectric layer covers the top surfaces of the fins; and
performing an ion implantation process on the fins using the gate sidewall spacers and the shadowing sidewall spacers as a mask to form lightly doped regions in the fins.

2. The method according to claim 1, wherein:
the sidewall material layer is made of silicon nitride.

3. The method according to claim 1, wherein:
a height of the shadowing sidewall spacers is in a range of approximately 100 Å-350 Å.

4. The method according to claim 1, wherein:
a thickness of the sidewall material layer is in a range of approximately 15 Å-80 Å.

5. The method according to claim 1, wherein:
the sidewall material layer is etched by a dry etching process to form the shadowing sidewall spacers and the gate sidewall spacers.

6. The method according to claim 5, wherein:
etching gases of the dry etching process include $CF_4$, $CH_3F$, and $O_2$;
a flow rate of $CF_4$ is in a range of approximately 5 sccm-100 sccm;
a flow rate of $CH_3F$ is in a range of approximately 8 sccm-50 sccm;
a flow rate of $O_2$ is in a range of approximately 10 sccm-100 sccm;
a radio frequency power of the dry etching process is in a range of approximately 50 W-300 W;
a DC voltage of the dry etching process is in a range of approximately 30 V-100 V;
an etching time is in a range of approximately 4 seconds-50 seconds; and
a pressure of the dry etching process is in a range of approximately 10 mTorr-2000 mTorr.

7. The method according to claim 1, wherein the semiconductor substrate has an N-type region for forming an N-type transistor, wherein:
ions of the ion implantation process for forming the lightly doped regions include one of As ions and P ions; and
a dose of the ions of the ion implantation process is in a range of approximately 1.0E14 atom/cm$^3$-1.0E16 atom/cm$^3$.

8. The method according to claim 1, wherein the semiconductor substrate has a P-type region for forming a P-type transistor, wherein:
ions of the ion implantation process for forming the lightly doped regions include one of B ions and $BF_2$ ions; and
a dose of the ions of the ion implantation process is in a range of approximately 1.0E14 atom/cm$^3$-8.0E15 atom/cm$^3$.

9. A method for fabricating a semiconductor structure, comprising:
providing a base substrate having a semiconductor substrate and a plurality of fins on the semiconductor substrate;
forming an isolation structure on the semiconductor substrate, between adjacent fins and with a top surface lower than top surfaces of the fins;
forming a gate structure across of the fins by covering portions of top surfaces and side surfaces of the fins;
forming a sidewall material layer to cover the gate structure and the fins;
etching the sidewall material layer to form gate sidewall spacers on side surfaces of the gate structure and to form shadowing sidewall spacers on portions of the side surfaces of the fins adjacent to the isolation structure;
performing an ion implantation process on the fins using the gate sidewall spacers and the shadowing sidewall spacers as a mask to form lightly doped regions in the fins;
after forming the lightly doped regions, further comprising:
removing the shadowing sidewall spacers; and
forming doped source/drain regions in the fins at both sides of the gate structure.

10. The method according to claim 9, wherein forming the doped source/drain regions comprises:
forming stress layers in the fins at both sides of the gate structure; and
performing ion implantation processes on the stress layers.

11. The method according to claim 10, after performing the ion implantation processes, further comprising:
performing a thermal annealing process to form the doped source/drain regions in the fins at both sides of the gate structure.

12. A semiconductor structure, comprising:
a base substrate having a semiconductor substrate and a plurality of the fins on the semiconductor substrate;
an isolation structure on the semiconductor substrate between adjacent fins and with a top surface lower than top surfaces of the fins;
a gate structure, including a gate dielectric layer and a gate electrode layer, across the fins by covering portions of side surfaces and top surfaces of the fins;
gate sidewall spacers on side surfaces of the gate structure and shadowing sidewall spacers on portions of the side surfaces of the fins adjacent to the isolation structure, wherein the shadowing sidewall spacers are isolated from the fins by the gate dielectric layer and the gate dielectric layer covers the top surfaces of the fins; and
doped source/drain regions in the fins at both sides of the gate structure,
wherein a doping concentration of portions of the fins in a direction perpendicular to a top surface of the semiconductor substrate away from the isolation structure is greater than a doping concentration of portions of the fins adjacent to the isolation structure.

13. The semiconductor structure according to claim 12, wherein:
the gate sidewall spacers are made of silicon nitride.

14. The semiconductor structure according to claim 12, wherein:
a thickness of the gate sidewall spacers is in a range of approximately 60 nm-200 nm.

15. The semiconductor structure according to claim 12, wherein:

the doping concentration of the portions of the fins away from the isolation structure is greater than the doping concentration of the portions of the fins adjacent to the isolation structure for approximately 1.3 times to 2 times.

16. The semiconductor structure according to claim 12, wherein, the semiconductor substrate includes an N-type region for forming an N-type transistor, wherein:

the doping concentration of the portions of the fins away from the isolation structure is in a range of approximately 1.0E20 atom/cm$^3$-1.0E22 atom/cm$^3$; and the doping concentration of the portions of the fins adjacent to the isolation structure is in a range of approximately 1.8E19 atom/cm$^3$-1.5E21 atom/cm$^3$.

17. The semiconductor structure according to claim 12, wherein, the semiconductor substrate includes a P-type region for forming a P-type transistor, wherein:

the doping concentration of the portions of the fins away from the isolation structure is in a range of approximately 1.0E20 atom/cm$^3$-1.0E22 atom/cm$^3$; and the doping concentration of the portions of the fins adjacent to the isolation structure is in a range of approximately 1.8E19 atom/cm$^3$-1.5E21 atom/cm$^3$.

18. The semiconductor structure according to claim 12, further comprising:

stress layers in the fins at both sides of the gate structure, wherein the stress layers include doped regions and the doped regions are portions of the doped source/drain regions.

19. The semiconductor structure according to claim 18, wherein:

the stress layers are made of one or more of phosphor doped silicon and phosphor doped silicon germanium.

20. The semiconductor structure according to claim 18, wherein:

the stress layers are one or more of U-shaped and Σ-shaped.

* * * * *